(12) United States Patent
Moosburger et al.

(10) Patent No.: US 9,159,890 B2
(45) Date of Patent: Oct. 13, 2015

(54) OPTOELECTRONIC SEMICONDUCTOR COMPONENT

(71) Applicant: OSRAM Opto Semiconductors GmbH, Regensburg (DE)

(72) Inventors: Juergen Moosburger, Regensburg (DE); Britta Goeoetz, Regensburg (DE); Georg Dirscherl, Tegernheim (DE); Wolfgang Moench, Pentling (DE); Alexander Linkov, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/181,104

(22) Filed: Feb. 14, 2014

(65) Prior Publication Data

US 2014/0246690 A1    Sep. 4, 2014

(30) Foreign Application Priority Data

Feb. 15, 2013  (DE) .......................... 10 2013 101 530
Feb. 15, 2013  (DE) .......................... 10 2013 101 532

(51) Int. Cl.
*H01L 33/00*  (2010.01)
*H01L 33/60*  (2010.01)
*G03B 15/02*  (2006.01)
(Continued)

(52) U.S. Cl.
CPC ............... *H01L 33/60* (2013.01); *G03B 15/02* (2013.01); *G03B 9/02* (2013.01); *G03B 2215/0567* (2013.01); *H01L 33/58* (2013.01)

(58) Field of Classification Search
CPC .......... H01L 33/58; H01L 33/60; G03B 9/02; G03B 15/05; G03B 2215/0567
USPC .................................................. 257/98
See application file for complete search history.

(56) References Cited

U.S. PATENT DOCUMENTS 3,756,720  A  *  9/1973  Skala ............................... 356/37
4,931,829  A  *  6/1990  Hakamada ...................... 355/68
5,563,924  A  * 10/1996  Winkelmann .................. 378/150

(Continued)

FOREIGN PATENT DOCUMENTS

DE        19644726 A1    4/1998
DE     102006060781 A1    4/2008
(Continued)

OTHER PUBLICATIONS

"Micro Mirror Arrays," Institute of Nanostructure Technologies and Analytics, Feb. 2009, 1, page, http://te.ina-kassel.de/index.php/mikrospiegel_en.html.

(Continued)

*Primary Examiner* — Vongsavanh Sengdara
(74) *Attorney, Agent, or Firm* — Slater & Matsil, L.L.P.

(57) ABSTRACT

An optoelectronic semiconductor component includes one or more light-emitting diode chips. The light-emitting diode chip has a main radiation side. A diaphragm is arranged downstream of the main radiation side along a main radiation direction of the light-emitting diode chip. The diaphragm is mounted on or in a component housing. The main radiation side has a mean edge length of at least 50 μm. The diaphragm can be switched from light-impervious to light-pervious. The diaphragm comprises precisely one opening region for radiation transmission. The semiconductor component can be used as a flashlight for a mobile image recording device.

20 Claims, 6 Drawing Sheets

(51) Int. Cl.
H01L 33/58 (2010.01)
G03B 9/02 (2006.01)

(56) References Cited

U.S. PATENT DOCUMENTS

| | | | |
|---|---|---|---|
| 6,383,577 B1 | 5/2002 | Chidichimo et al. | |
| 2005/0201716 A1* | 9/2005 | Wuestefeld | 385/147 |
| 2005/0265150 A1* | 12/2005 | Hirayama et al. | 369/44.37 |
| 2007/0008285 A1* | 1/2007 | Chiu et al. | 345/166 |
| 2008/0179611 A1* | 7/2008 | Chitnis et al. | 257/98 |
| 2012/0018754 A1* | 1/2012 | Lowes | 257/98 |
| 2013/0044370 A1* | 2/2013 | Seyfried et al. | 359/385 |
| 2013/0126930 A1* | 5/2013 | Kabuki et al. | 257/98 |

FOREIGN PATENT DOCUMENTS

| | | |
|---|---|---|
| DE | 102009034250 A1 | 1/2011 |
| DE | 102010021011 A1 | 11/2011 |
| DE | 102011017098 A1 | 10/2012 |
| DE | 102011101323 A1 | 11/2012 |
| DE | 102012104148 A1 | 11/2013 |
| EP | 2282226 A1 | 2/2011 |
| WO | 2007068761 A1 | 6/2007 |
| WO | 2010058326 A1 | 5/2010 |

OTHER PUBLICATIONS

Argun, A.A., et al., "The First Truly All-Polymer Electrochromic Devices," Advanced Materials, vol. 15, No. 15, Aug. 5, 2003, pp. 1338-1341.

Cupelli, D., et al., "Photoswitching in Polymer-Dispersed Liquid Crystals," Journal of Applied Physics, vol. 100, American Institute of Physics, Jul. 25, 2006, 024508-024508-5.

Cupelli, D., et al., "Self-Adjusting Smart Windows Based on Polymer-Dispersed Liquid Crystals," Solar Energy Materials & Solar Cells, vol. 93, Issue 11, Elsevier, Ltd., Aug. 29, 2009, pp. 2008-2012.

De Filpo, G., et al., "Fast, Self-Supplied, All-Solid Photoelectrochromic Film," Journal of Power Sources, vol. 195, Issue 13, Jan. 25, 2010, pp. 4365-4369.

De Filpo, G., et al., "Flexible Nano-Photo-Electrochromic Film," Chemistry of Materials, vol. 18, American Chemical Society, Aug. 22, 2006, pp. 4662-4666.

Draheim, J., et al., "Variable Aperture Stop Based on the Design of a Single Chamber Silicone Membrane Lens with Integrated Actuation," Optics Letters, vol. 36, No. 11, May 26, 2011, pp. 2032-2034.

Feenstra, J., et al., "Electrowetting Displays," Liquavista BV, May 2009, 15 pages.

Heikenfeld, J., et al., "Electrofluidic Displays Using Young-Laplace Transposition of Brilliant Pigment Dispersions," Nature Photonics, vol. 3, May 2009, pp. 292-296.

Hollas, J.M., "Modern Spectroscopy," John Wiley & Sons, Ltd., Fourth Edition, Jan. 2004, pp. 41-71.

Hongbin, Y., et al., "Optofluidic Variable Aperture," Optics Letters, vol. 33, No. 6, Mar. 15, 2008, pp. 548-550.

Kim, C.H., et al., "A Wafer-Level Micro Mechanical Global Shutter for a Micro Camera," IEEE 22nd International Conference on Micro Electro Mechanical Systems, Jan. 25-29, 2009, pp. 156-159.

Macchione, M., et al., "Improvement of Response Times in Photoelectrochromic Organic Film," Chemistry of Material, vol. 16, No. 8, American Chemical Society, Mar. 26, 2004, pp. 1400-1401.

Macchione, M., et al., "Laser-Writable, Electrically Erasable Photoelectrochromic Organic Film," Advanced Materials, vol. 15, No. 4, Feb. 17, 2003, pp. 327-329.

Miyake, T., "Samsung Developing MEMS Shutter for Mobile Cameras," Tech-On!, Nikkei Microdevices, May 15, 2009, 2 pages.

Mueller, P., et al., "An Optofluidic Concept for a Tunable Micro-iris," Journal of Microelectromechanical Systems, vol. 19, Issue: 6, Dec. 2010, pp. 1477-1484.

Mueller, P., et al., "Bistable Optofluidic Attenuator with Integrated Electrowetting Actuation and High Dynamic Range," 2011 16th International Solid-State Sensors, Actuators and Microsystems Conference (TRANSDUCERS), Jun. 5-9, 2011, pp. 1550-1553.

Mueller, P., et al., "A Fully Integrated Optofluidic Micro-Iris," IEEE 25th International Conference on Micro Electro Mechanical Systems (MEMS), Jan. 29, 2012-Feb. 2, 2012, pp. 7-10.

Nicoletta, F.P., et al., "Light Responsive Polymer Membranes: A Review," Membranes, vol. 2, Mar. 2, 2012, pp. 134-197.

Smith, T., "Samsung Etches Tiny Mechanical Shutter for Cameraphones," The Register, May 15, 2009, 1 page, http://www.theregister.co.uk/2009/05/15/samsung_mems_shutter/.

Stich, A., et al., "LEDs for Flash Applications," Application Note, Opto Semiconductors, OSRAM, Sep. 2010, 14 pages.

Syms, R.R.A., et al., "Sliding-blade MEMS Iris and Variable Optical Attenuator," Journal of Micromechanics and Microengineenng, vol. 14, Sep. 14, 2004, pp. 1700-1710.

Tsai, C., et al., "Circular Dielectric Liquid Iris," Optics Letters, vol. 35, No. 14, Jul. 15, 2010, pp. 2484-2486.

Viereck, V., et al., "Large-area Applications of Optical MEMS: Micromirror Arrays Guide Daylight, Optimize Indoor Illumination," Photonik International, vol. 2, Nov. 12, 2009, pp. 48-49.

Viereck, V., et al., "Sun Glasses for Buildings Based on Micro Mirror Arrays: Technology, Control by Networked Sensors and Scaling Potential," 5th International Conference on Networked Sensing Systems, Jun. 17-19, 2008, pp. 135-139.

Walze, G., "Microstructured Surfaces in Combination with Optical Circuit Mechanisms for the Daylight Management," Albert-Ludwig-University, Sep. 2005, 179 pages. (Partial Translation).

* cited by examiner

OPTOELECTRONIC SEMICONDUCTOR COMPONENT

This application claims the benefit of German Application No. 10 2013 101 530.1, filed on Feb. 15, 2013 and German Application No. 10 2013 101 532.8 filed on Feb. 15, 2013, which application is hereby incorporated herein by reference.

TECHNICAL FIELD

An optoelectronic semiconductor component is provided.

SUMMARY OF THE INVENTION

Embodiments of the invention to provide an optoelectronic semiconductor component in which a light-emitting diode chip can be covered.

According to at least one embodiment, the semiconductor component includes one or more light-emitting diode chips. The light-emitting diode chips are configured to emit visible radiation in operation. The at least one light-emitting diode chip is preferably a blue-emitting chip based on AlInGaN, downstream of which there is arranged, in order to generate yellow light, a conversion layer having a phosphor. White light is preferably emitted by the light-emitting diode chip.

According to at least one embodiment, the light-emitting diode chip has a main radiation side. A predominant portion of the radiation generated in operation is emitted from the light-emitting diode chip on the main radiation side. Predominant can mean a proportion of at least 50% or 75%.

According to at least one embodiment, the semiconductor component includes a diaphragm. The diaphragm can be switched from a light-impervious state into a light-pervious state. Switching of the diaphragm is particularly preferably possible in a reversible manner.

The diaphragm can comprise one or more movable components. The components are movable relative to the light-emitting diode chip. The components can be mechanically rigid or at least partly mechanically rigid components, in particular solid bodies, or also liquids. In the case of liquids, there is not only a microscopic movement, for example, by the diffusion of molecules, but also a macroscopic movement of fixed volumes.

According to at least one embodiment, the diaphragm is stationary relative to the light-emitting diode chip. In particular, the diaphragm does not have any macroscopic, movable components. This does not necessarily exclude the possibility that the diaphragm comprises microscopic components which are movable, for example, by diffusion.

According to at least one embodiment, the diaphragm is arranged downstream of the main radiation side of the light-emitting diode chip. That is to say, the diaphragm follows the main radiation side along a main radiation direction of the light-emitting diode chip. The diaphragm can be permanently arranged downstream of the light-emitting diode chip. That is to say, in normal use of the semiconductor component, the diaphragm is in this case located in the same position. The diaphragm is then not moved in normal use.

According to at least one embodiment, the semiconductor component has a component housing. The component housing is visible from outside the semiconductor component in normal use. The diaphragm is mounted in or on the component housing.

According to at least one embodiment, the main radiation side has a mean edge length or a mean diameter of at least 50 µm or 100 µm or 150 µm or 200 µm or 300 µm or 500 µm and/or of not more than 2 mm or 1.5 mm or 1 mm. The main radiation side is larger than a typical size of a pixel of a portable image display device.

According to at least one embodiment, the diaphragm has precisely one opening region for radiation transmission. The diaphragm is not segmented into several areas separated from one another by a light-impervious region. The opening region constitutes a continuous, for example, circular or rectangular, region, when seen from above. Upon switching of the diaphragm, the opening region is preferably freed by the at least one component.

According to at least one embodiment, the diaphragm extends uninterruptedly and continuously over the main radiation side of the light-emitting diode chip. That is to say, there are no recesses or perforations in the diaphragm in either the open or the closed state. The diaphragm can extend with an unchanged material composition over the entire main radiation side and/or over the entire opening region. The diaphragm then constitutes a continuous surface having the same optical effect in both the light-impervious and the light-pervious state.

According to at least one embodiment, switching of the diaphragm takes place by a movement of the component or of at least one of the components or by a movement of at least a part-region of the at least one component. When the diaphragm is closed and opened, the at least one component is thus changed in terms of its position.

According to at least one embodiment, the semiconductor component is a flashlight for a mobile image display device. The semiconductor component is used in particular as a flashlight in a mobile telephone. Flashlight can mean that the light-emitting diode chip is configured to generate a flash having a duration of at least 15 µs or 10 ms or 100 ms and/or of not more than 1 s or 500 ms or 200 ms. The light generated during the flash is white light. The white light can have a spectral composition in the visible spectral range similar to that of sunlight.

In at least one embodiment, the optoelectronic semiconductor component comprises a light-emitting diode chip with a main radiation side, a diaphragm, the diaphragm is arranged downstream of the main radiation side along a main radiation direction of the light-emitting diode chip, and a component housing in or on which the diaphragm is mounted. The main radiation side has a mean edge length of at least 50 µm. The diaphragm can be switched from light-impervious to light-pervious and vice versa. Moreover, the diaphragm has precisely one opening region for radiation transmission.

In at least one embodiment, the optoelectronic semiconductor component comprises one or more light-emitting diode chips. The at least one light-emitting diode chip has a main radiation side. A diaphragm of the semiconductor component has at least one component that is movable relative to the light-emitting diode chip. The diaphragm is arranged downstream of the main radiation side along a main radiation direction of the light-emitting diode chip. The diaphragm is mounted on or in a component housing. The main radiation side has a mean edge length of at least 50 µm or 200 µm. By a movement of the at least one component, the diaphragm can be switched from light-impervious to light-pervious. The diaphragm comprises precisely one opening region for radiation transmission. The semiconductor component is further a flashlight for a mobile image display device.

In at least one embodiment, the optoelectronic semiconductor component comprises a light-emitting diode chip with a main radiation side. A diaphragm, stationary relative to the light-emitting diode chip, is permanently arranged downstream of the main radiation side along a main radiation direction of the light-emitting diode chip. The diaphragm is mounted on or in a component housing. The main radiation side has a mean edge length of at least 50 µm or 200 µm. The diaphragm can be switched from light-impervious to light-pervious and vice versa. The diaphragm has precisely one opening region for radiation transmission. The diaphragm extends uninterruptedly and continuously over the main radiation side.

Conventional mobile telephones and other portable devices generally have an image recording device, for example, with a CMOS chip. A flashlight necessary therefor can be produced with one or with several light-emitting diodes, in particular with white-emitting light-emitting diodes. Such white-emitting light-emitting diodes normally have a blue-emitting semiconductor chip based on AlInGaN in combination with a yellow-emitting, phosphorescent converter layer with at least one phosphor. By means of the converter layer, a portion of the blue light is converted into yellow light, so that white light is emitted overall.

The converter layer of yellow appearance is visible from outside. The appearance, in particular of high-quality mobile telephones, is thereby impaired. Owing to the diaphragm in the semiconductor component described here, the converter layer is not visible when the light-emitting diode is switched off. Furthermore, the converter layer can be protected from damaging influences, for example, from ultraviolet radiation from sunlight, when the light-emitting diode chip is not in operation, as a result of which the working life of the light-emitting diode chip can be increased.

According to at least one embodiment, the diaphragm has a switching time from light-impervious to light-pervious of not more than 0.5 s or 0.25 s or 0.1 s. Alternatively or in addition, that switching time is at least 500 µs or 1 ms or 5 ms. The same or also longer switching times can apply for switching from light-pervious to light-impervious.

According to at least one embodiment, the light-emitting diode chip is not visible from outside the component housing when the diaphragm is switched to light-impervious. In particular, the component housing is then impervious to radiation at least in places.

According to at least one embodiment, the opening region completely covers the light-emitting diode chip and the main radiation side, when seen from above along the main radiation direction. In other words, in the open, light-pervious state of the diaphragm, the light-emitting diode chip is completely visible to an observer, when seen from above.

According to at least one embodiment, the opening region has a mean diameter of at least 50 µm or 150 µm or 250 µm or 500 µm. Alternatively or in addition, the mean diameter is not more than 7 mm or 5 mm or 3 mm or 1 mm.

According to at least one embodiment, the diaphragm is arranged immediately optically downstream of the light-emitting diode chip. This can mean that there is no further optically active, beam-shaping component such as a lens between the main radiation side and a side of the diaphragm facing the light-emitting diode chip. A lens permanently integrated in the light-emitting diode chip or on the light-emitting diode chip, which lens is located directly on the light-emitting diode chip, can thereby remain disregarded.

According to at least one embodiment, a distance between the diaphragm and the light-emitting diode chip is not more than 5 mm or 3 mm or 1.5 mm. The semi-conductor component can then have a small installation height.

According to at least one embodiment, the diaphragm is in the form of a lens at least in places. That is to say, the diaphragm is configured for beam shaping of a radiation generated by the light-emitting diode chip in operation. For example, the diaphragm is then in the form of a collecting lens and/or in the form of a Fresnel lens at least in places.

According to at least one embodiment, the light-emitting diode chip is accommodated in a light box that reflects light specularly or diffusely. The light box preferably has a degree of reflection of at least 50% or 80% or 90% in the visible spectral range.

According to at least one embodiment, the light box is fastened indirectly or directly to the component housing and/or to the diaphragm. The light box can reach the diaphragm, in particular the opening region.

According to at least one embodiment, at least one lens is located between the main radiation side and a side of the diaphragm facing the light-emitting diode chip. The at least one lens is configured for beam shaping of the radiation generated by the light-emitting diode chip. It is possible that the lens is mounted directly on the side of the diaphragm facing the light-emitting diode chip.

According to at least one embodiment, the light-emitting diode chip is a housed chip. The light-emitting diode chip is then accommodated in a chip housing. The light-emitting diode chip is then preferably electrically connected by means of the chip housing. The chip housing can also be configured for beam shaping of the radiation generated by the light-emitting diode chip.

According to at least one embodiment, the chip housing is fastened directly to the component housing and/or to the diaphragm and/or to the opening region of the diaphragm. For example, the chip housing is adhesively bonded to the component housing or to the diaphragm. Alternatively, it is possible that the chip housing is arranged spaced apart from the component housing and/or from the diaphragm.

According to at least one embodiment, in the spectral range from 440 nm to 720 nm inclusive or from 470 nm to 720 nm inclusive, a reflection factor or a mean reflection factor of the diaphragm, when it is switched to the light-impervious state, differs from a reflection factor or a mean reflection factor of the component housing at the diaphragm by not more than 30 or by not more than 15 percentage points. This applies when seen from outside the semiconductor component. This difference preferably applies for every wavelength in the mentioned spectral range. Likewise, it preferably also applies for the type of reflection, that is to say whether it is specular or diffuse. An external appearance of the diaphragm, when viewed from outside, then does not differ or does not differ significantly from an external appearance of the component housing near the diaphragm. As a result of the diaphragm, therefore, an external appearance of the semiconductor component is similar to that of the remaining parts of the device into which the semiconductor component is fitted.

According to at least one embodiment, the semiconductor component comprises at least two movable components. All the movable components or at least some of the components are formed by folding elements. In the light-pervious state of the diaphragm, the folding elements are folded in or angled, and in the light-impervious state of the diaphragm, the folding elements are extended or not folded in, or vice versa.

According to at least one embodiment, at least some of the folding elements are movable in a direction parallel to the main radiation direction. For example, folding is effected by some of the folding elements moving towards or away from the light-emitting diode chip when the diaphragm is opened.

According to at least one embodiment, the semiconductor component comprises several components, at least some or all of which are in the form of roll elements. In the light-impervious state of the diaphragm, the roll elements are rolled out and elongated, and in the light-pervious state of the diaphragm, the roll elements are rolled up. An axis about which rolling up takes place is preferably oriented parallel to the main radiation side and perpendicular to the main radiation direction.

According to at least one embodiment, the movable components or at least one of the movable components is/are impervious to radiation. Upon opening or closing of the diaphragm, the at least one radiation-pervious component is moved out of the opening region or into the opening region. Upon opening or closing of the diaphragm, at least the radiation-impervious component of the diaphragm moves.

According to at least one embodiment, some of the movable components or all of the movable components are slide elements. In the light-pervious state of the diaphragm, the slide elements are located over the main radiation side in the opening region, and in the light-impervious state of the diaphragm they are located next to the main radiation side and the opening region, when seen from above. The individual slide elements preferably do not change their shape but are moved as a whole.

According to at least one embodiment, the slide elements move in a direction perpendicular to the main radiation direction, for example, with a tolerance of not more than 45° or 30° or 15° or 10°.

According to at least one embodiment, the movable components do not overlap or do not overlap significantly in the closed and/or in the open state of the diaphragm. This can mean that the movable components abut one another or only overlap by, for example, at most 10% or 20% or 30% of a total surface area of the components in question, when seen from above. This is the case in particular if the components are in the form of solid bodies.

According to at least one embodiment, the diaphragm comprises one or more light-impervious liquids as the movable component. The light-impervious liquid is located over the main radiation side only in the light-impervious state of the diaphragm. Upon switching of the diaphragm, a macroscopic rearrangement of the light-impervious liquid takes place. Preferably, components of the liquid are not simply separated, for example, by diffusion.

According to at least one embodiment, the diaphragm additionally comprises a light-pervious liquid as a movable component. In the light-pervious state of the diaphragm, the light-pervious liquid is located in the opening region and preferably covers the main radiation side. It is possible that the light-pervious liquid acts at least in part as an optical component, in particular as a lens.

According to at least one embodiment, the light-pervious liquid and the light-impervious liquid are exchangeable or separable upon switching of the diaphragm. The exchange of the liquids takes place, for example, in a pressure-induced manner or on account of applied electric fields. Pumping is likewise possible.

According to at least one embodiment, the diaphragm has a membrane as the movable component. The membrane is configured to move the light-impervious liquid. For example, the light-impervious liquid is displaced from the opening region by deformation of the membrane. The membrane itself is preferably light-pervious.

According to at least one embodiment, the diaphragm comprises a liquid crystal display cell or the diaphragm consists of such a cell. The liquid crystal display cell can be a Schadt-Helfried cell, for example, a TN cell, STN cell, DSTN cell or TSTN cell. The diaphragm preferably comprises or consists of precisely one such cell. The opening region is formed by this cell.

According to at least one embodiment, the diaphragm comprises one or more saturable absorbers or consists of one or more such absorbers. In a saturable absorber, the transmission capacity is dependent upon the intensity of the irradiated light. At higher light intensities, saturable absorbers are radiation-pervious and at low light intensities they are light-impervious.

According to at least one embodiment, a quencher is added to the saturable absorber. By means of such a quencher, a decay time, for example, of the saturable absorber, within which the absorber becomes radiation-impervious again, can be adjusted. It is thereby possible to prevent the diaphragm from becoming undesirably light-pervious in strong sunlight or in the presence of other strong external light sources.

According to at least one embodiment, the diaphragm comprises dispersed liquid crystals. The liquid crystals are in particular embedded in an electrically insulating polymer, which acts as a matrix. Such dispersed liquid crystals are also known as PDLCs, Polymer-Dispersed Liquid Crystals. PDLCs can be controlled in terms of their light transmitting capacity by changing the light intensity and/or by changing an applied voltage.

According to at least one embodiment, the polymer is doped with photo-conducting molecules and/or with photochromic molecules. Doping in this case is doping with organic molecules, in particular. The switching properties of the diaphragm can be adjusted by doping.

According to at least one embodiment, the diaphragm comprises a photo-electrochromic material or consists of such a material. In such materials, the light transmitting capacity is adjustable by way of the irradiated light intensity and/or by way of an applied voltage.

According to at least one embodiment, the diaphragm comprises an electrochromic, a thermochromic and/or a photochromic material or consists thereof. Electrochromic materials or systems are in some cases also referred to as gasochromic systems when control of the electrochromic reaction, which is in particular a redox reaction, which leads to a color change, is initiated by a gas, for example, by contact with hydrogen. Photochromic switches can also be initiated and/or assisted by closing an electric circuit. These are then so-called photoelectrochromic systems or materials. In thermochromic or thermotropic systems, a temperature change leads to a change in the color or in the scattering behavior of the material.

Chemically, such switches or materials are found in both inorganic chemistry and organic chemistry, in particular as polymers. For example, this effect is known in auto-dimming motor vehicle mirrors, in which the redox system $WO_3$—$LiWO_3$ can be used, as well as in the context of this application. In the case of the diaphragm, however, this system would have to be reversed so that the system becomes transparent when the flashlight is to pass through. If light from outside falls on the system, darkening takes place automatically and the light-emitting diode chip is not visible. If a photograph is to be taken, the diaphragm is switched to transparent when the camera is activated. At molecular level, the system is normally oxidized again, in particular from $LiWO_3$ to $WO_3$.

In the case of the organic systems or materials it is possible to use in particular azo dyes, which are based on di(phenyl)diazene and are switchable by cis-trans isomerism. This light-induced isomerization typically takes place on the picosecond scale with high quantum yields. It is likewise possible to use materials which react to a change in the pH value with a color change. Such a pH change can in turn be produced optically and/or by means of a temperature change.

According to at least one embodiment, the diaphragm is formed of a solid which does not or does not significantly change its shape in normal use of the semiconductor component. In particular, the polymer or polymers used are solid-like, so that their viscosity in regular operation is preferably at least 100 Pa·s.

According to at least one embodiment, the optoelectronic semiconductor component comprises exactly one diaphragm.

According to at least one embodiment, the optoelectronic semiconductor component comprises exactly one light-emitting diode chip that is followed by the diaphragm. Said light-emitting diode chip preferably emits white light in operation.

According to at least one embodiment, the optoelectronic semiconductor component comprises a plurality of light-emitting diode chips that preferably form exactly one group. In other words, all light-emitting diode chips are followed by the same diaphragm and by means of the diaphragm, it is preferably not possible to camouflage only part of the light-emitting diode chips but only all light-emitting diode chips together. Thus, said group is followed by the diaphragm. In particular, said group is designed to emit white light in operation. A correlated color temperature of the white light emitted by group can be tuned, for example, between 2500 K and 6500 K, inclusive.

BRIEF DESCRIPTION OF THE DRAWINGS

An optoelectronic semiconductor component described herein is explained in greater detail below by means of exemplary embodiments with reference to the drawing. Identical reference numerals thereby indicate identical elements in the individual figures. However, no scale references are shown; instead, individual elements can be shown exaggeratedly large for the purpose of better understanding.

DETAILED DESCRIPTION OF ILLUSTRATIVE EMBODIMENTS

Figure 1A:
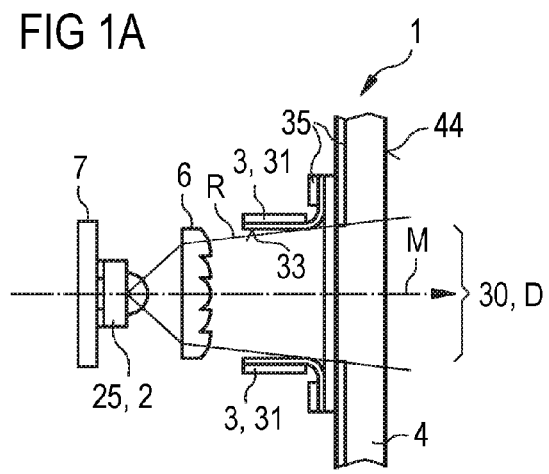
FIGS. 1A-1B (collectively, FIG. 1), 2A-2B (collectively, FIG. 2), 3A-3B (collectively, FIG. 3), 4A-4B (collectively, FIG. 4), 5A-5B (collectively, FIG. 5), 6A-6B (collectively, FIG. 6), 7, 8, 9, 10A-10C (collectively, FIG. 10) and 11-17 show schematic sectional representations and top views of exemplary embodiments of optoelectronic semiconductor components described herein, and FIGS. 18A-18B (collectively, FIG. 18) show schematic representations of spectra of the radiation emitted by optoelectronic semiconductor components described herein.

FIG. 1 shows an exemplary embodiment of an optoelectronic semiconductor component 1 which is a flashlight, for example, for a mobile telephone. The semiconductor component 1 comprises a light-emitting diode chip 2, which according to FIG. 1 is housed in a chip housing 25 and is followed by an integrated lens. For example, the light-emitting diode chip 2 is mounted on a printed circuit board 7 and electrically contacted by way of the printed circuit board 7.

Figure 1B:
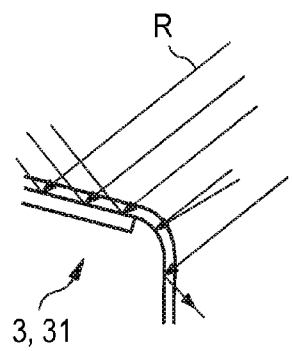
Figure 2A:
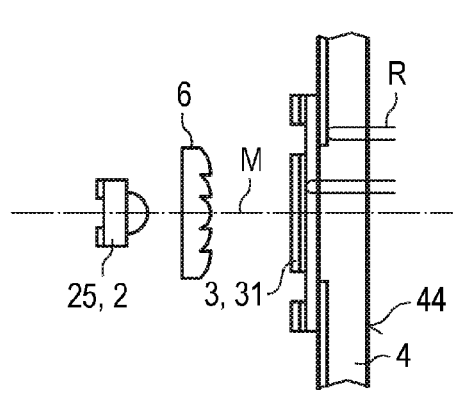
Figure 2B:
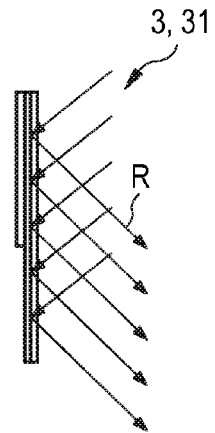

The semiconductor component 1 further includes a component housing 4 having an outside 44. A diaphragm 3 is mounted on or in the component housing 4. The diaphragm 3 is shown in the open state in FIG. 1A and in the closed state in FIG. 2A. FIGS. 1B and 2B each show only the diaphragm 3 in the open and closed state.

The diaphragm 3 has several movable components, which are in the form of folding elements 31. In the closed state, the folding elements 31 are located in an opening region 30 of the diaphragm 3, which follows the light-emitting diode chip 2 along a main radiation direction M. In the open state, the folding elements 31 free the opening region 30. A mean diameter D of the opening region 30 is greater than a main radiation side 20 of the light-emitting diode chip 2.

Upon opening of the diaphragm 3, the folding elements 31 move at least partially in the direction away from the component housing 4 and in the direction towards the light-emitting diode chip 2. Folding and switching of the folding elements 31 takes place preferably electrically by way of a control unit 35, which is shown only schematically. Electric lines are not shown or are shown only in simplified form.

An outer face 33 of the folding elements 31 is in a similar form to the outside 44 of the component housing 4. In the closed state of the diaphragm 3, an observer therefore sees virtually no difference between the component housing 4 and the diaphragm 3 from outside the semiconductor component 1.

As in all the other exemplary embodiments, a lens 6, for example, a collecting lens in the form of a Fresnel lens, is optionally located between the light-emitting diode chip 2 and the diaphragm 3. Further, additional optical components can optionally be mounted along the main radiation direction M.

Such flip elements are described, for example, in the publication Viereck et al., Large-Area Applications of Optical MEMS: Micro-Mirror Arrays Guide Daylight, Optimized Indoor Illumination in Photonic International 2009, Vol. 2, pages 48 and 49. The disclosure content of that publication is included by reference.

Figure 3A:
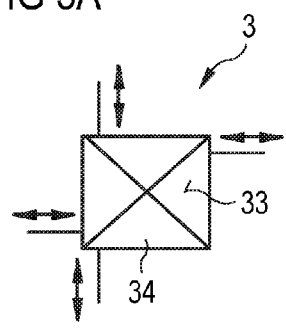
Figure 3B:
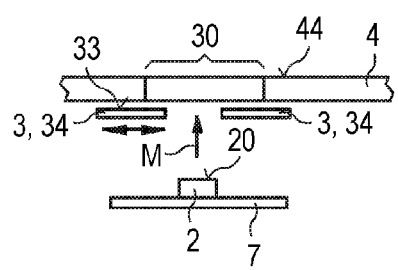

FIG. 3A shows a schematic top view of the diaphragm 3 in the closed state and FIG. 3B shows it in the half-open state. The diaphragm 3 is formed by four slide elements 34, which abut one another in the closed state. The slide elements 34 are triangular in shape when seen from above. A direction of movement, symbolized by double-headed arrows, is oriented perpendicular to a base of the triangular shape of the slide elements 34. The direction of movement is further oriented perpendicular to the main radiation direction M.

Electrodes for control are not shown in FIG. 3 in order to simplify the representation. In a departure from the representation, it is not necessary for the slide elements 34 to be mounted on a side of the component housing 4 facing the light-emitting diode chip 2. The slide elements 34 can likewise be integrated in the component housing 4 or can be located on the outside 44.

Such diaphragms are described, for example, in the publication Syms et al., Sliding-Blade MEMS Iris and Variable Optical Attenuator in J. Micromech. Microeng., 2004, Vol. 14, pages 1700-1710. The disclosure content of that document is included by reference.

Figure 4A:
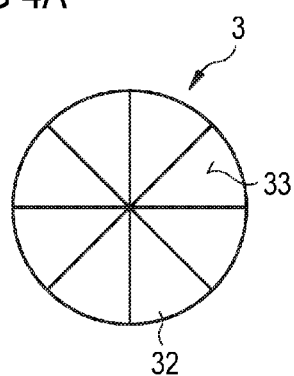
Figure 4B:
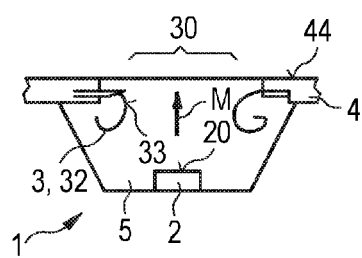

In the further exemplary embodiment, see the top view of the closed diaphragm 3 in FIG. 4A and the sectional representation with the open diaphragm 3 in FIG. 4B, the diaphragm 3 comprises several roll elements 32. In the closed state of the diaphragm 3, the roll elements 32 are extended, and in the open state they are rolled up. An axis about which rolling up takes place is oriented approximately parallel to the main radiation side 20 and perpendicular to the main radiation direction M. Other than shown, it is possible that the roll elements 32 overlap partly in the closed state.

The at least one light-emitting diode chip 2 is optionally accommodated in a light box 5 that reflects diffusely or specularly. In a departure from the representation according to FIG. 4B, it is also possible, as in all the other exemplary embodiments, for several light-emitting diode chips to be mounted in the opening region 30, in particular in order to increase a color rendering index.

Such a diaphragm 3 is also described in the publication Che-Heung Kim et al., A Wafer-Level Micromechanical Global Shutter for a Microcamera in IEEE International Conference On Microelectromechanical Systems-MEMS, 2009, pages 156-159. The disclosure content of that publication is included by reference.

Figure 5A:
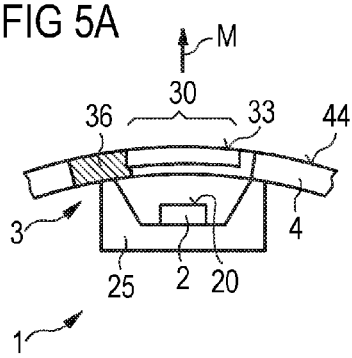
Figure 5B:
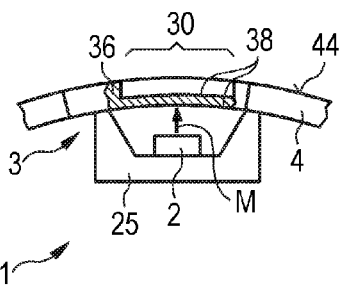
Figure 6A:
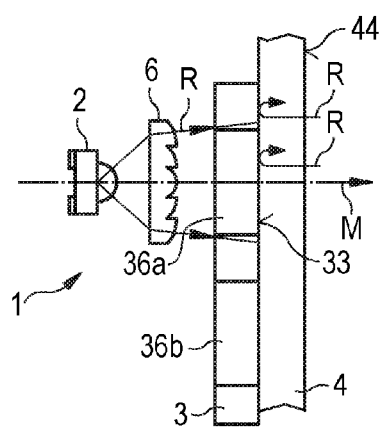
Figure 6B:
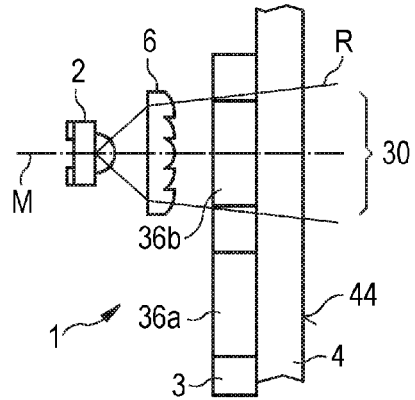
Figure 7:
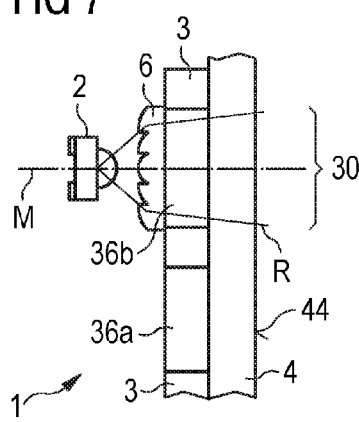
Figure 8:
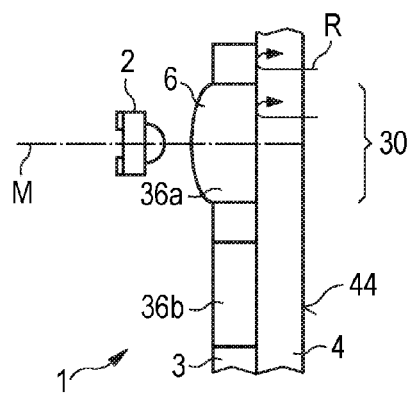

In FIG. 5A, a further exemplary embodiment of the semiconductor component 1 is shown with the diaphragm 3 open, and in FIG. 5B it is shown with the diaphragm 3 closed. As in all the other exemplary embodiments, it is also possible that the diaphragm 3 and the component housing 4 have curved outsides 33, 44 and/or that the diaphragm 3 is completely covered by the component housing 4. The light-emitting diode chip 2 is housed in a chip housing 25, and the chip housing 25, as is also possible in all the other exemplary embodiments, is mounted directly on the component housing 4 and/or on the diaphragm 3.

The diaphragm 3 comprises as the movable component a light-impervious liquid 36. In the open state of the diaphragm 3, the liquid 36 is located outside the opening region 30 in a reservoir. In the closed state, the liquid 36 is brought into the opening region 30. The liquid 36 is controlled, for example, by the application of an electric voltage. The liquid 36 can have the same color as the outside 44 of the component housing 4.

Such diaphragms are described, for example, in the publication Heikenfeld et al., Electrofluidic Displays Using Young-Laplace Transposition of Brilliant Pigments Dispersions in Nature Photonics, 2009, Vol. 3, pages 292-296. The disclosure content of that publication is included by reference.

In a departure from the representation according to FIG. 5, it is also possible that, instead of the entirety of the liquid, only in particular electrically charged particles migrate in an electric field, controlled by an electric field. In such an electrophoretic system, the particles are then located outside the opening region 30 in the open state of the diaphragm and are located at least partially inside the opening region 30 in the closed state. The movable component of the diaphragm 3 is then formed by these preferably macroscopic particles.

According to FIGS. 6 to 10, the diaphragm in each case comprises a light-impervious liquid 36a and a light-pervious liquid 36b. In the closed state of the diaphragm 3, the light-impervious liquid 36a is located in the opening region 30, see FIG. 6A, and in the open state the light-pervious liquid 36b is located in the opening region 30, see FIG. 6B. The light-impervious liquid 36a preferably has the same color as the component housing 4 or the outside 44 of the component housing 4. The diaphragm 3 can be mounted on an inside of the component housing 4 or can be integrated into the component housing 4.

As is shown in FIG. 6, and as is possible in all the other exemplary embodiments, a lens 6 can be located between the diaphragm 3 and the light-emitting diode chip 2. The lens 6 is, for example, a Fresnel lens for light concentration. Alternatively, it is possible that the lens 6 is mounted directly on the diaphragm 3, see FIG. 7. The lens 6 can likewise be formed by an outer shape of the opening region 30, see FIG. 8.

Figure 9:
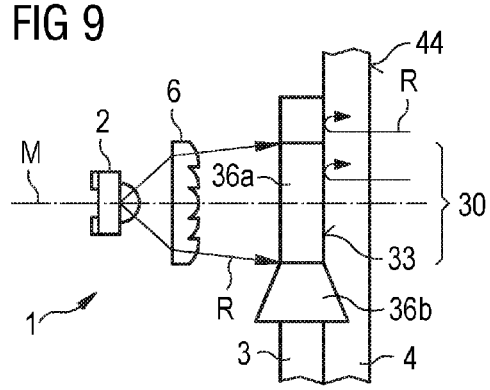

For more rapid rearrangement of the liquids 36a, 36b, the reservoir in which the light-pervious liquid 36b is located according to FIG. 9 can have a greater thickness. A mean distance of the liquid 36b in the reservoir from the opening region 30 can thereby be reduced and a higher switching frequency can be achieved. A corresponding configuration is also possible in all the other exemplary embodiments.

Figure 10A:
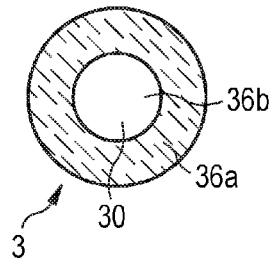
Figure 10B:
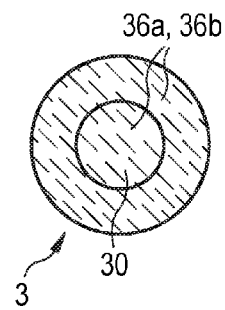
Figure 10C:
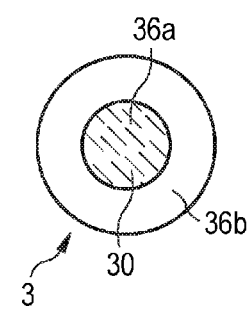

FIGS. 10A to 10C show schematic top views of the diaphragm 3. According to FIG. 10A, the diaphragm 3 is open and the radiation-pervious liquid 36b is located in the opening region 30. The light-impervious liquid 36a is accommodated in a reservoir around the opening region 30.

The correspondingly reverse situation is shown in FIG. 10C for a closed state of the diaphragm 3.

According to FIG. 10B, the diaphragm 3 is switched to radiation-impervious and the light-impervious liquid 36a is located both in the reservoir and in the opening region 30.

Such diaphragms 3 based on electrowetting and/or electrophoresis are described, for example, in the publication Müller et al., An Optofluidic Concept For A Tunable Micro-Iris, in Journal of Microelectromechanical Systems, 2010, Vol. 19, pages 1477-1484, in the publication Müller et al., in Proceedings Of The 16th International Conference on Solid-State Sensors, Actuators And Microsystems (Transducers), 2011, pages 1550-1553, in the publication Müller et al., in Proceedings Of the MEMS-Conference, 2012, or in the publication Tsai et al., Circular Dielectric Liquid Iris, in Optics Letters, 2010, Vol. 35, pages 2484-2486. The disclosure content of those publications is included by reference.

Figure 11:
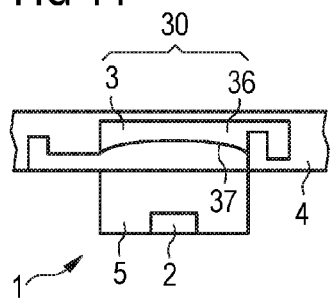

In the exemplary embodiment shown in the sectional representation according to FIG. 11, the diaphragm 3 comprises a light-pervious membrane 37. The light-impervious liquid 36 can be displaced from the opening region 30 by a movement of the membrane 37. The diaphragm 3 is thereby switchable. The displacement of the light-impervious liquid 36 is carried out, for example, by means of air pressure or by introduction of a further light-pervious liquid (not shown).

Such diaphragms 3 are described, for example, in the publication Draheim et al., Variable Aperture Stop Based On the Design Of A Single Chamber Silicon Membrane Lense With Integrated Actuation, in Optics Letters, 2011, Vol. 36, pages 2032-2034 or in the publication Hongbin et al., Optofluidic Variable Aperture, in Optics Letters, 2008, Vol. 33, pages 548-550. The disclosure content of those publications is included by reference.

Figure 12:
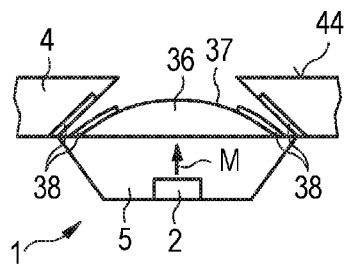

In the exemplary embodiment shown in FIG. 12 too, the diaphragm 3 comprises a light-pervious membrane 37. The membrane 37 filled with the light-impervious liquid 36 is deformed by application of a voltage to the electrodes 38, whereby the diaphragm 3 is switchable.

Such a diaphragm is to be found, for example, in publication EP 2 282 226 A1. The disclosure content of that publication is included by reference.

By the use of such diaphragms 3, the light-emitting diode chip 2 and the optional lenses are not visible from outside the component housing 4. The system integration of the light shaping lens and the closing diaphragm, see for example FIG. 8 or 12, allows a very small installation height of the semiconductor component 1 to be achieved. Depending on the configuration of the diaphragm 3, electrical energy merely has to be supplied for opening or closing the diaphragm 3 and is not permanently necessary.

Figure 13:
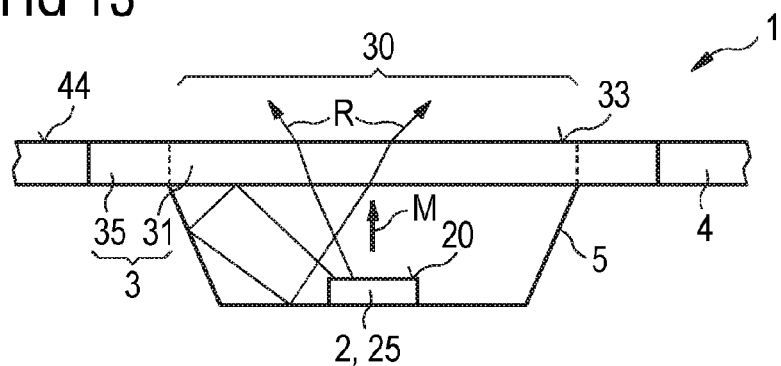

FIG. 13 shows a further exemplary embodiment of the optoelectronic semiconductor component 1. The diaphragm 3 is mounted in a component housing 4. The diaphragm 3 has a liquid crystal display cell, for example, a Schadt-Helfried cell. The diaphragm 3 further includes a control unit 35, in each case shown in only highly simplified form. Individual components of the liquid crystal display cell 31, such as polarizers, liquid crystal layers or electrodes, are not shown specifically. In an opening region 30, the diaphragm 3 can reversibly be switched from light-impervious to light-pervious. The diaphragm 3 has precisely one opening region 30 and accordingly precisely one liquid crystal display cell 31.

The light-emitting diode chip 2 is mounted in the light box 5 with diffusely reflecting insides, which face the light-emitting diode chip 2. If a radiation R is reflected at the liquid crystal display cell 31, a polarization direction of the radiation R can be changed upon reflection at the light box 5 and the radiation R is subsequently able to exit the light box 5.

The liquid crystal display cell 31 is operated in either so-called direct mode or reverse mode. In direct mode, the liquid crystal display cell is light-pervious when an electric voltage is applied. The opposite applies in reverse mode.

The semiconductor component 1 is, for example, a flashlight for a mobile telephone. When the light-emitting diode chip 2 is switched off, the liquid crystal display cell 31 is light-impervious, so that the light-emitting diode chip 2 is not visible from outside. When the light-emitting diode chip 2 is switched on, the diaphragm 3 is switched to light-pervious. With the aid of the diffusely reflecting light box 5, so-called photon recycling can be achieved.

Figure 14:
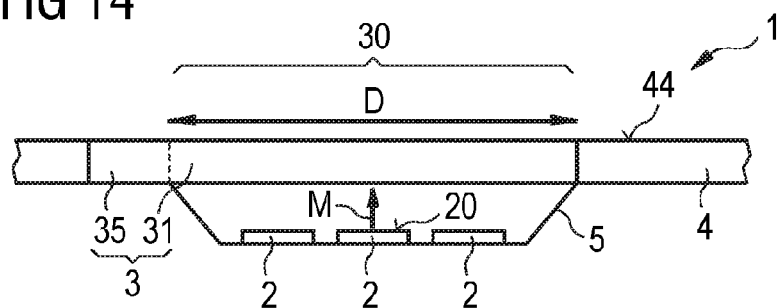

In the exemplary embodiment according to FIG. 14, the semiconductor component 1 has several light-emitting diode chips 2. The light-emitting diode chips 2 are, for example, accommodated unhoused in the light box 5. It is possible that the light-emitting diode chips 2 emit in different spectral ranges. For example, two of the light-emitting diode chips 2 are configured to generate white light and one of the light-emitting diode chips 2 is configured to generate red light in order to improve the color rendering index. The light-emitting diode chips 2 can be controllable electrically independently from one another. In all the other exemplary embodiments too, several light-emitting diode chips 2 can be present.

Figure 15:
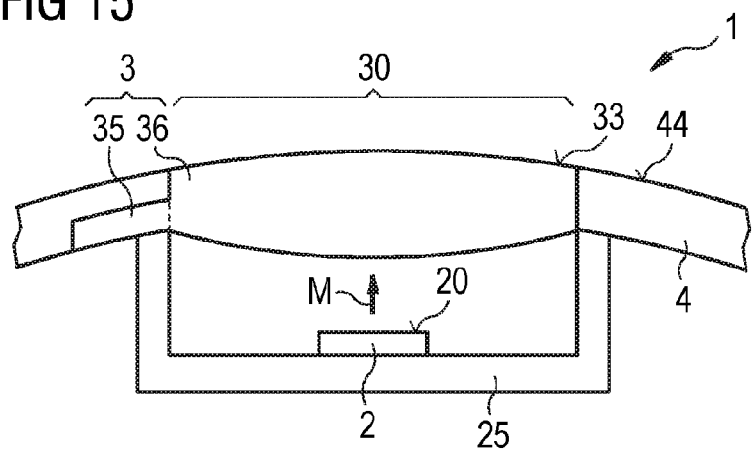

FIG. 15 illustrates a further exemplary embodiment of the semiconductor component 1. According to FIG. 15, the chip housing 25, in which the light-emitting diode chip 2 is located, is mounted, for example adhesively bonded, directly on the component housing 4. The diaphragm 3 has in the opening region 30 the form of a collecting lens, as is also possible in all the other exemplary embodiments. It is likewise possible in each case that the outsides 33, 44 are not planar but have a curvature.

In the opening region 30, the semiconductor component 1 has a photo-chromic material or a photo-electrochromic material, which can accordingly have the outer form of a lens. Additional components of the diaphragm 3, such as electrodes, are not shown. The material 36 comprises, for example, photo-responsive polymeric materials. These are functional polymers which are able to absorb light and, owing to the radiation absorption, undergo intramolecular or intermolecular physical or chemical transformations. By means of such changes in the molecular structure, macroscopic properties such as in particular the radiation transmission can be adjusted.

By operation of the light-emitting diode chip 2 and the associated irradiation of the material 36, the material 36 can be switched to light-pervious. If the light-emitting diode chip 2 is switched off, the material 36 returns to an initial state and becomes light-impervious.

The material 36 is, for example, methylene blue, or MB for short. By absorption of visible light, the color of the material 36 changes from blue to transparent. With regard to such photo-chromic materials, reference is made to the publications Macchione et al., Laser-Writable, Electrically Erasible Photo-Electrochromic Organic Film in Adv. Mater., 2003, Vol. 15, pages 327-329, and Macchione et al., Improvement of Response Times in Photo-Electrochromic Organic Film in Chem. Mater., 2004, Vol. 16, pages 1400-1401. The disclosure content of those publications is included by reference.

A photo-electrochromic diaphragm with a conducting polymer that is coated with dye-functionalized titanium dioxide particles can exhibit a transition from a colored to a transparent appearance with switching times in the decisecond range. Structures for such diaphragms are also described in the publications De Filpo et al., Flexible Nanophoto-Electrochromic Film in Chem. Mater., 2005, Vol. 18, pages 4662-4666, and Argun et al., The First Truly All-Polymer Electrochromic Devices in Adv. Mater., 2003, Vol. 15, pages 1338-1341, and De Filpo et al., Fast-Self-Supplied, All-Solid Photo-Electrochromic Film in J. Power Sources 2010, Vol. 195, pages 4365-4369. The disclosure content of those publications is likewise included by reference.

An example of an inorganic material for the diaphragm 3 is tungsten trioxide $WO_3$. A color change is based on the reduction of $W^{6+}$ to $W^{5+}$ according to the redox equation $3 WO_3 + 3 LiI \Leftrightarrow LiWO_3 + I_3$. Further, similarly functioning examples are $Cu_2O$ or the hydrides of the rare earths or also mixtures with a transition metal such as Ni, Mn, Co, Fe with magnesium.

The redox system is preferably so composed that it is not reduced by outside light, whereby the diaphragm becomes radiation-impervious. In addition, switching is implemented which reverses the redox equilibrium upon use of the flashlight so that the diaphragm becomes radiation-pervious. A current flow must be sufficiently great that the flashlight does not prematurely color the diaphragm 3 dark again.

Figure 16:
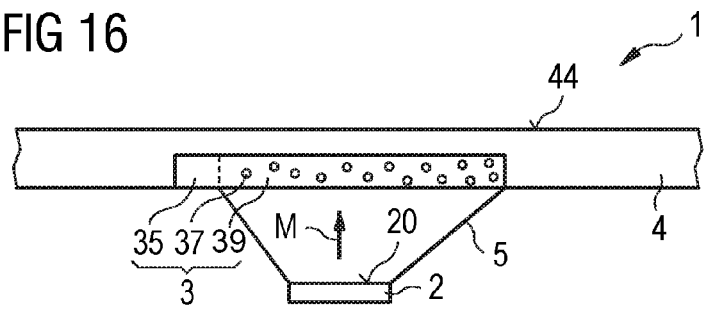

In the exemplary embodiment according to FIG. 16, the diaphragm 3 is optionally completely covered by a material of the component housing 4, so that an outer face can be formed completely by a material of the component housing 4. This is possible if the component housing 4 is formed of a radiation-pervious material at least in places. In other words, the diaphragm 3 can be integrated completely inside the component housing 4. Such a structure is also possible in all the other exemplary embodiments.

The diaphragm 3 comprises liquid crystals 37 which are embedded in an electrically insulating polymer 39. Such dispersed liquid crystals are also referred to as PDLCs. Such PDLCs are formed, for example, by embedding the micrometer-sized liquid crystal drops in the polymer matrix 39 or filling voids in the polymer 39 with the liquid crystals 37.

In the light-impervious state, an alignment of the liquid crystals 37 is by chance. By means of an external impetus, for example by means of light and/or by means of an applied voltage, the liquid crystals 37 can be aligned in parallel, whereby the diaphragm 3 becomes light-pervious.

Owing to the polymer 39, a solid-like form can be achieved. Furthermore, additives can be added to the polymer 39 in order to adjust the optical properties. The liquid crystals 37 embedded in the polymer 39 can be operated in direct mode or in reverse mode. Doping with small amounts of photochromic or photo-conducting molecules is possible. For example, Photosol dyes, zinc, phthalocyanine or dilithium phthalocyanine can be used as dopants.

PDLCs are described, for example, in the publications Cupelli et al., Photo-Switching in Polymer Dispersed Liquid Crystals in J. Appl. Phys., 2006, Vol. 100, page 024508, and in Cupelli et al., Self-Adjusting Smart Windows Based on Polymer-Dispersed Liquid Crystals in Sol. Energy Mater. Sol. Cells, 2009, Vol. 93, pages 2008-2012 or in U.S. Pat. No. 6,383,577 B1. The disclosure content of those publications is included by reference.

Figure 17:
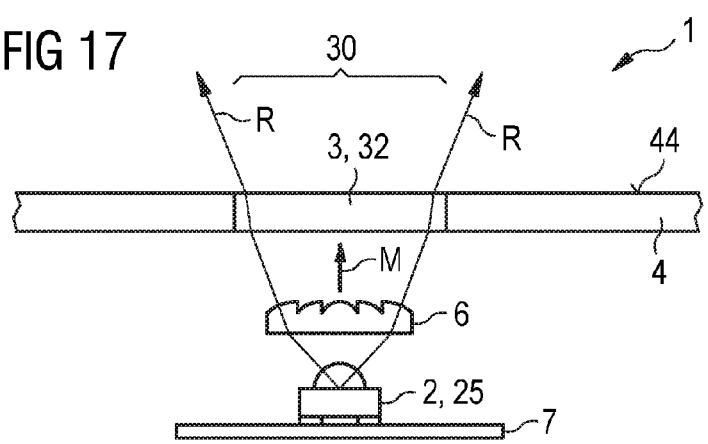

In the exemplary embodiment according to FIG. 17, a lens 6, for example, in the form of a Fresnel lens, is arranged between the diaphragm 3 and the light-emitting diode chip 2. Such a lens can also be present in all the other exemplary embodiments. In a departure from the representation, the lens 6 can also be mounted directly on a side of the diaphragm 3 facing the light-emitting diode chip 2.

According to FIG. 17, the opening region 30 is formed by a saturable absorber 32. The saturable absorber can be a semiconductor absorber or an absorber of an organic material. Such a saturable absorber 32 is non-transparent in an electronic basic state and transparent in an electronically excited state. The excited state is achieved by optical excitation. Accordingly, such a saturable absorber is optically switchable from transparent to non-transparent. After the light-emitting diode chip 2 as the light source has been switched off, the absorber 32 becomes non-transparent again. The absorber 32 can comprise a quencher.

Figure 18A:
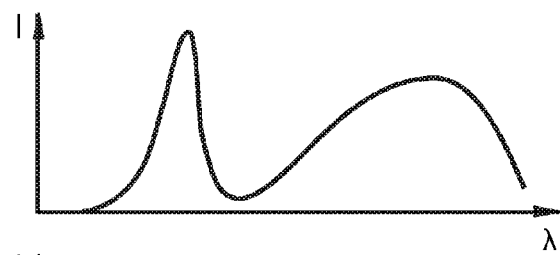
Figure 18B:
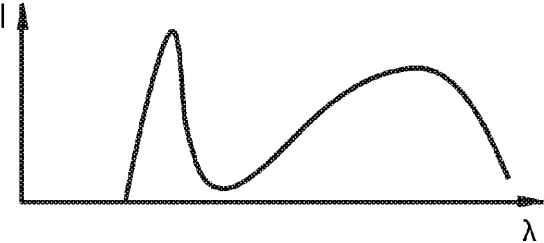

It is possible that the absorber 32 absorbs only in a specific spectral range or exhibits an absorption that is uniform in the visible spectral range. If the absorber 32 absorbs radiation, for example, only in the blue spectral range or in the near-ultraviolet spectral range, it is possible that the original emission spectrum of the light-emitting diode chip 2, see FIG. 18A, remains substantially unchanged and merely undergoes changes at a blue edge, see FIG. 18B. In FIGS. 18A and 18B, a wavelength λ is in each case plotted against an intensity I.

The invention described here is not limited by the description made with reference to the exemplary embodiments. Instead, the invention encompasses any novel feature and any combination of features, including in particular any combination of features in the patent claims, even if that feature or that combination is not itself explicitly indicated in the patent claims or exemplary embodiments.

What is claimed is:

1. An optoelectronic semiconductor component comprising:
    a light-emitting diode chip with a main radiation side;
    the main radiation side having a mean edge length of at least 50 μm;
    a diaphragm arranged downstream of the main radiation side along a main radiation direction of the light-emitting diode chip wherein the diaphragm can be switched from light-impervious to light-pervious and vice versa and wherein the diaphragm has precisely one opening region for radiation transmission; and
    a component housing in or on which the diaphragm is mounted.

2. The optoelectronic semiconductor component according to claim 1, wherein the diaphragm is shaped like a lens and is configured for beam shaping of a radiation generated by the light-emitting diode chip in operation.

3. The optoelectronic semiconductor component according to claim 1, wherein the light-emitting diode chip is accommodated in a diffusely reflecting light box, the light box being fastened directly to the component housing and/or to the diaphragm.

4. The optoelectronic semiconductor component according to claim 1, further comprising a lens for beam shaping of the radiation generated by the light-emitting diode chip mounted between the main radiation side and the diaphragm.

5. The optoelectronic semiconductor component according to claim 1, wherein the light-emitting diode chip is accommodated in a chip housing and is electrically connected by the chip housing, the chip housing being fastened directly to the diaphragm and/or to the component housing.

6. The optoelectronic semiconductor component according to claim 1, wherein:
    the diaphragm can be switched from light-impervious to light-pervious with a switching time of not more than 0.3 s;
    the light-emitting diode chip is not visible from outside the component housing when the diaphragm is switched to light-impervious;
    the opening region covers the light-emitting diode chip completely, when seen along the main radiation direction of the light-emitting diode chip;
    the opening region has a mean diameter from 50 μm to 7 mm inclusive;
    the semiconductor component is a flashlight for a mobile image recording device;
    the diaphragm is arranged optically immediately downstream of the light-emitting diode chip;
    a distance between the diaphragm and the light-emitting diode chip is not more than 3 mm;
    the optoelectronic semiconductor component comprises exactly one diaphragm; and
    the optoelectronic semiconductor component comprises exactly one light-emitting diode chip emitting white light, or a plurality of light-emitting diode chips that form exactly one group, wherein the group is followed by the diaphragm and a correlated color temperature of white light emitted by the group can be tuned.

7. The optoelectronic semiconductor component according to claim 6, wherein, in the spectral range from 470 nm to 720 nm inclusive, a reflection factor of the diaphragm, when it is switched to a light-impervious state, differs from a reflection factor of the component housing at the diaphragm by not more than 30 percentage points, when seen from outside the semiconductor component; and
    wherein the diaphragm comprises a component that is movable relative to the light-emitting diode chip.

8. The optoelectronic semiconductor component according to claim 7, wherein the diaphragm comprises a plurality of movable components and at least some of the components are folding elements that are folded away in a light-pervious state of the diaphragm and are extended in the light-impervious state of the diaphragm, the folding elements moving at least partially in a direction parallel to the main radiation direction.

9. The optoelectronic semiconductor component according to claim 7, wherein the diaphragm comprises a plurality of movable components and at least some of the components are roll elements that are rolled up in a light-pervious state of the diaphragm and are extended in the light-impervious state.

10. The optoelectronic semiconductor component according to claim 7, wherein the diaphragm comprises a plurality of movable components and at least some of the movable components are slide elements that are located over the main radiation side in a light-pervious state of the diaphragm and next to the main radiation side in the light-impervious state, when seen from above, the slide elements moving in a direction perpendicular to the main radiation direction.

11. The optoelectronic semiconductor component according to claim 7, wherein the diaphragm comprises a light-impervious liquid as the movable component, the light-impervious liquid being located over the main radiation side only in the light-impervious state of the diaphragm.

12. The optoelectronic semiconductor component according to claim 11, wherein the diaphragm further comprises a light-pervious liquid as a movable component, the liquids being exchangeable.

13. The optoelectronic semiconductor component according to claim 11, wherein the diaphragm comprises as an additional movable component for moving the light-impervious liquid.

14. The optoelectronic semiconductor component according to claim 6,
    wherein, in the spectral range from 470 nm to 720 nm inclusive, a reflection factor of the diaphragm, when it is switched to a light-impervious state, differs from a reflection factor of the component housing at the diaphragm by not more than 30 percentage points, when seen from outside the semiconductor component,
wherein the diaphragm can reversibly be switched from light-impervious to light-pervious and vice versa,
wherein the diaphragm extends uninterruptedly and continuously over the main radiation side, and
wherein the diaphragm is free of movable mechanical components.

15. The optoelectronic semiconductor component according to claim 14, wherein the diaphragm comprises precisely one liquid crystal display cell.

16. The optoelectronic semiconductor component according to claim 14, wherein the diaphragm comprises a saturable absorber.

17. The optoelectronic semiconductor component according to claim 16, wherein a quencher is added to the saturable absorber.

18. The optoelectronic semiconductor component according to claim 14, wherein the diaphragm comprises liquid crystals dispersed in an electrically insulating.

19. The optoelectronic semiconductor component according to claim 18, wherein a polymer is doped with photoconducting molecules or with photo-chromic molecules or wherein the diaphragm comprises a photo-electrochromic material.

20. An optoelectronic semiconductor component comprising:
 a light-emitting diode chip with a main radiation side;
 a diaphragm that comprises a component that is movable relative to the light-emitting diode chip, the diaphragm being arranged downstream of the main radiation side along a main radiation direction of the light-emitting diode chip;
 a lens for beam shaping of radiation generated by the light-emitting diode chip mounted between the main radiation side and the diaphragm; and
 component housing in or on which the diaphragm is mounted, wherein:
 the main radiation side has a mean edge length of at least 50·mu·m,
 the diaphragm can be switched from light-impervious to light-pervious and vice versa by a movement of the component,
 the diaphragm has precisely one opening region for radiation transmission, the semiconductor component is a flashlight for a mobile image recording device,
 the light-emitting diode chip is accommodated in a chip housing and is electrically connected by the chip housing,
 the chip housing is fastened directly to the diaphragm and to the component housing, and
 in the spectral range from 470 nm to 720 nm inclusive, a reflection factor of the diaphragm, when it is switched to a light-impervious state, differs from a reflection factor of the component housing in a region immediately adjacent to the diaphragm by not more than 30 percentage points, when seen from outside the semiconductor component.

* * * * *

UNITED STATES PATENT AND TRADEMARK OFFICE
CERTIFICATE OF CORRECTION

PATENT NO. : 9,159,890 B2  
APPLICATION NO. : 14/181104  
DATED : October 13, 2015  
INVENTOR(S) : Moosburger et al.

It is certified that error appears in the above-identified patent and that said Letters Patent is hereby corrected as shown below:

In the Claims

In Col. 15, line 20, claim 18, following delete "electrically insulating." and insert --electrically insulating polymer.--.

In Col. 16, line 10, claim 20, delete "50·mu·m" and insert --50 μm--.

Signed and Sealed this  
Twenty-third Day of August, 2016

Michelle K. Lee  
*Director of the United States Patent and Trademark Office*